(12) United States Patent
Wang

(10) Patent No.: US 12,270,845 B2
(45) Date of Patent: Apr. 8, 2025

(54) METHODOLOGY FOR MEASURING DIELECTRIC AND MAGNETIC MATERIAL PROPERTIES

(71) Applicant: Microhortone LLC, Central, SC (US)

(72) Inventor: Pingshan Wang, Central, SC (US)

( * ) Notice: Subject to any disclaimer, the term of this patent is extended or adjusted under 35 U.S.C. 154(b) by 1482 days.

(21) Appl. No.: 16/575,439

(22) Filed: Sep. 19, 2019

(65) Prior Publication Data
US 2021/0088568 A1 Mar. 25, 2021

(51) Int. Cl.
*G01R 27/28* (2006.01)
*G01N 15/1429* (2024.01)
*G01R 27/26* (2006.01)
*H01P 11/00* (2006.01)

(52) U.S. Cl.
CPC ......... *G01R 27/28* (2013.01); *G01N 15/1429* (2013.01); *G01R 27/2623* (2013.01); *H01P 11/003* (2013.01)

(58) Field of Classification Search
CPC ................ G01R 27/28; G01R 27/2623; G01N 15/1404; G01N 15/1429
See application file for complete search history.

(56) References Cited

U.S. PATENT DOCUMENTS

| | | | |
|---|---|---|---|
| 2004/0193382 A1* | 9/2004 | Adamian ............... | B82Y 30/00 702/118 |
| 2006/0115890 A1* | 6/2006 | Muller ............... | G01N 15/1404 435/287.1 |
| 2014/0032190 A1* | 1/2014 | Shlepnev ............... | G01B 15/08 703/2 |
| 2016/0187402 A1* | 6/2016 | Roelvink ............... | G01N 22/00 702/57 |
| 2018/0255669 A1* | 9/2018 | Kurimoto ............... | H02M 1/44 |
| 2019/0346545 A1* | 11/2019 | Sleasman ............. | H01Q 3/2611 |
| 2020/0309580 A1* | 10/2020 | Godager ................ | G01N 22/00 |

* cited by examiner

*Primary Examiner* — Jeff W Natalini

(57) ABSTRACT

A methodology for measuring the dielectric and magnetic properties of materials is provided. The method comprises a multi-section transmission line (TL) and multi-section fluidic channels. Two of the TL sections are incorporated with channel sections. The length-ratio of the two line-channel sections (LCS) is L':L". A network analyzer coupled to the TL can be configured to measure scattering parameters when the LCS have no material-under-measurement (MUM), one LCS has MUM, both LCSs have MUM. Then, the S-parameters are transformed to ABCD matrices. When L':L" is 2:1, the propagation constant of the LCSs can be calculated with analytical formulas over the measured frequency range. When L':L" is not 2:1, the propagation constant can be obtained with numerical root-searching algorithms. The properties of MUM can be extracted by use of models which relate the propagation constants with the given geometry and substrate of LCSs as well as the unknown MUM properties.

2 Claims, 7 Drawing Sheets

METHODOLOGY FOR MEASURING DIELECTRIC AND MAGNETIC MATERIAL PROPERTIES

(1) BACKGROUND OF THE INVENTION

Transmission lines of various types, such as microstrip lines, coplanar waveguides and hollow waveguides, have been used to measure or characterize material properties, including dielectric and magnetic properties. The materials can be in solid, liquid or gas phases. These materials can be placed on transmission lines, in direct contact or with no direct contact. For liquids, microfluidic and nanofluidic channels are promising to be powerful methods for real-time and in-situ measurement. Coated with absorbing materials, such as polymers, can also be performed for high sensitivity measurements, including gas measurements. In addition to significantly reducing sample volumes in traditional dielectric spectroscopy measurements, such as studying the structure and dynamics of protein and polymer, measuring cells in suspension, developing drugs, characterizing petroleum fluids and biodiesel, evaluating food and beverage quality, and analyzing biopharmaceutical processes, the method can enable real-time monitoring of liquids and particle-suspensions.

In all the measurements, however, calibrations are necessary in order to remove measurement uncertainties so quantitative material properties can be obtained. The calibrations can be performed with standard devices, such as Matching Load, Open and Short, which have pre-determined electrical impedance values, or reference materials, which have known properties. Accurate calibration is especially important when material volume is small, such as minute amount of liquids in microfluidic devices, or the targeted material property change is small. Accurate removal of the effects of measurement cables, connectors and test fixtures as well as operation uncertainties, such as cable connection repeatability, is necessary but challenging and inconvenient.

Many calibration techniques have been developed. Thru-Reflect-Line (TRL) is considered the most accurate calibration method and it only requires the single Line standard that has an accurate characteristic impedance, in addition to two approximately known standards. The multiline method uses redundant Line standards to minimize the effects of random errors, including variations from Line fabrications. Thus, calibration accuracy and bandwidth are improved over single Line TRL method. These methods, among others, have been adopted for microwave microfluidics applications. However, the use of standard components requires multiple connection-disconnection operations, which could result in significant measurement uncertainties that could be especially important for small volume samples. The single-connection method addresses the multi-connection issue, but multiple reference materials, such as air and water, are needed. As a result, measurement accuracy depends on reference quality. In addition to measurement complications and costs, the need for reference materials or standard calibration components makes it difficult for real-time and in-situ applications, such as inline process monitoring where reference materials are not available or the calibration operation is cumbersome. Therefore, self and auto-calibration methods are desired. There are a few reported self-calibration methods or "calibration-independent" methods. Our previous studies show that by use of a reservoir, the property of liquids can be quantitatively measured without external calibration standards or reference materials. Nevertheless, the method is inconvenient since accurate measurement of liquid volumes is necessary. At the same time, the method is difficult to use for solid or gas measurement. The single-length method uses a single measurement fixture to avoid additional parasitic elements that would produce errors in multi-line or multi-length efforts. Nevertheless, the method requires a reasonable initial guess of the sample dielectric constant for root-searching algorithm to work. The guess may be difficult when measuring unknown liquids. The calibration-independent methods use either air as a reference material or the material-under-test for self-reference. But multiline or repeated connection-disconnection operations are needed therein. Thus, a need exists for a simple methodology that can quantitatively measure material properties accurately.

(2) BRIEF SUMMARY OF THE INVENTION

The aspects and advantages of the invention will be set forth in part in the following description, or may be obvious from the description, or may be learned through practice of the invention.

One exemplary aspect of the present disclosure is directed to broadband measurement of liquid permittivity without using liquid reference materials or calibration standards. The method uses a single transmission line and a single microfluidic channel which intercepts the line twice. As a result, two transmission line sections are formed where intercepts occur. The lengths of the two transmission line sections can have a given ratio, such as 2:1, for convenient material property extraction from measurements. A plurality of measurements can be made with a vector network analyzer (VNA) or a device that has a transmitter and a receiver and configured for scattering parameter measurements. The two transmission line sections can be empty, or one is filled with liquid under measurement (LUM), or both are filled. A unique algorithm with closed-form formulas can be used to obtain quantitative liquid properties, such as permittivity or permeability. In another aspect, two separate microfluidic channels can be used in conjunction with a single transmission line. Then, the two channels can be filled with liquid or gas which are to be measured. In yet another aspect, solids, including films, can be characterized when the transmission line section ratio, such as 2:1 mentioned above, is satisfied.

The present method also relates to the use of nanofluidic channels for material property measurement. Additionally, the method can involve using interferometry approach to couple the transmission line to a VNA for high sensitivity measurement.

(3) BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

Figure 5A:
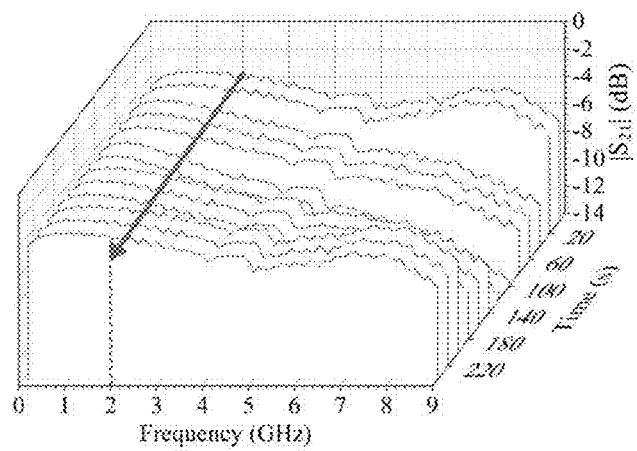
Figure 5B:
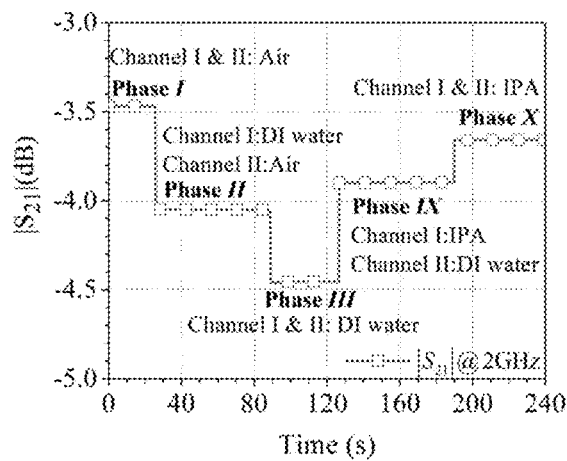
Figure 6A:
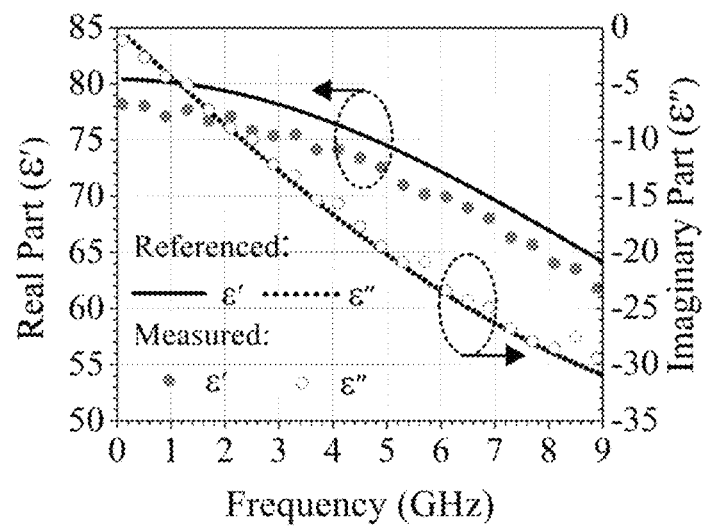
Figure 6B:
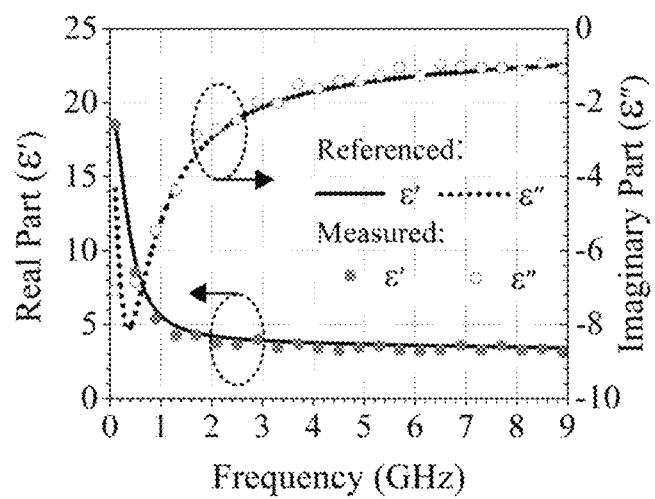
Figure 7:
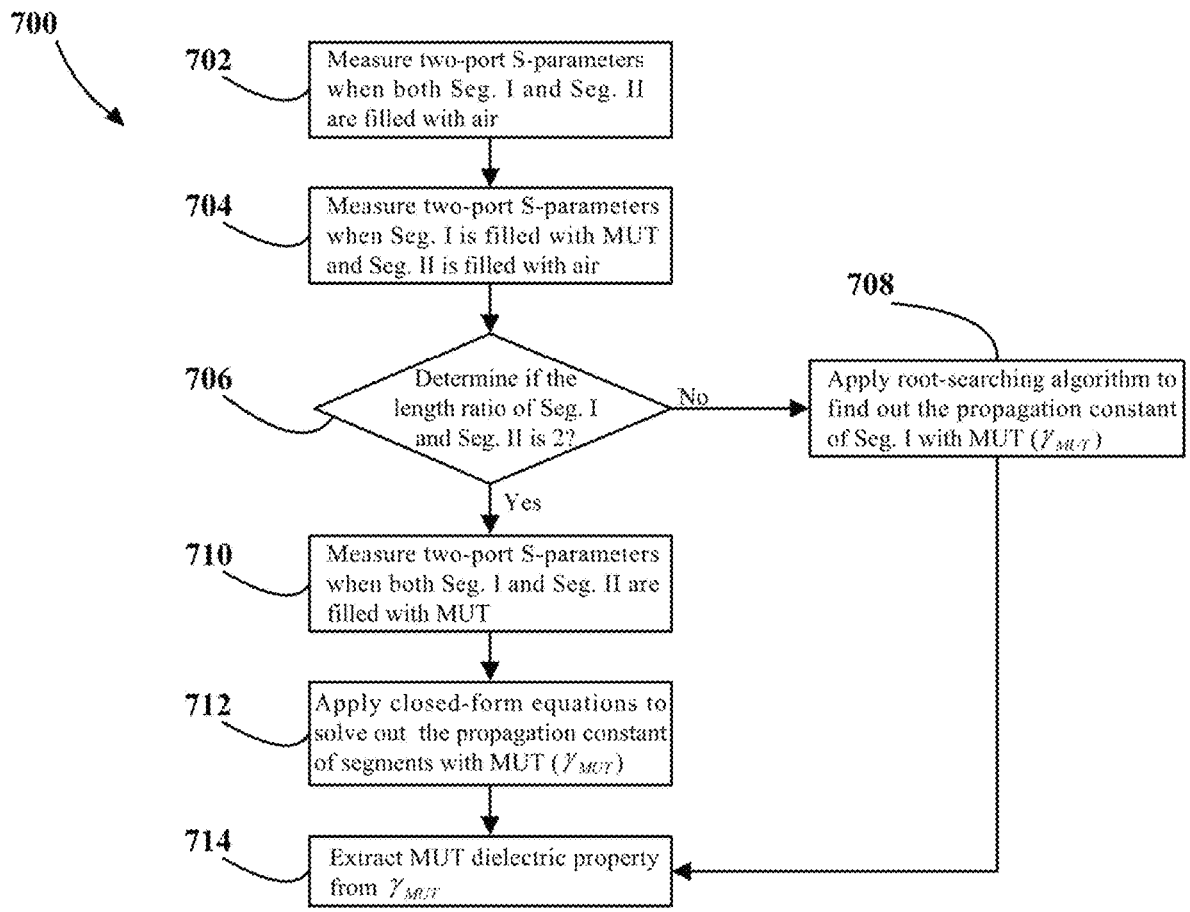

FIG. 4(a)-(d) illustrates the graphs of experimentally obtained complex permittivity of (a) IPA, (b) ethanol, (c) methanol, and (d) DI water with comparison to the values from Cole-Cole model according to an exemplary embodiment of the presented method;

FIG. 5(a) illustrates a graph depicting the real-time measurement results from 100 MHz to 9 GHz when DI water and IPA flows in succession in an exemplary embodiment of the methodology;

FIG. 5(b) illustrates a real-time measurement result of DI water and IPA flowing in succession at 2 GHz along the arrow in FIG. 5(a);

FIG. 6(a)-(b) illustrates the experimentally obtained complex permittivity of (a) DI water and (b) IPA with comparison to the values from Cole-Cole model according to an exemplary embodiment of the presented methodology;

FIG. 7 illustrates a flow diagram of a method according to an exemplary embodiment of the presented invention.

Repeat use of reference characters throughout the present specification and appended drawings is intended to represent same or analogous features or elements of the invention.

(4) DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Generally, the present application relates to automatic and self-calibration of devices for quantitative material measurement. The device described herein simultaneously addresses the need for calibration standards or reference material and the uncertainty of multiple connections. In actual embodiment, the transmission line does not need to be straight. Any type of transmission lines, including waveguides, can be used. The materials to be measured can be solid, such as thin films, gas, such as volatile organic chemicals (VOC, which can be absorbed with polymers for stronger signals), and liquids, including liquids with suspended particle.

In operation, a vector network analyzer (VNA) can be configured to measure the four scattering parameters or S-parameters ($S_{11}$, $S_{12}$, $S_{21}$, $S_{22}$), under three different states: there is no material-under-measurement (MUM, e.g. liquid), there is MUM on one transmission line section, and there is MUM on both transmission line sections. Then, the S-parameters are transformed to ABCD matrices. After processing the ABCD matrices, the propagation constant of the MUM line section can be calculated with analytical formulas when the length ratio of the two line-channel sections is 2:1 (or 1:2). When the ratio is not 2:1, numerical root-searching algorithms can be used to obtain the propagation constant of the MUM line section. The use of two line-channel sections, instead of one, can facilitate the searching process. Finally, the permittivity or permeability of MUM can be extracted by use of geometry and material specific models.

Figure 1A:
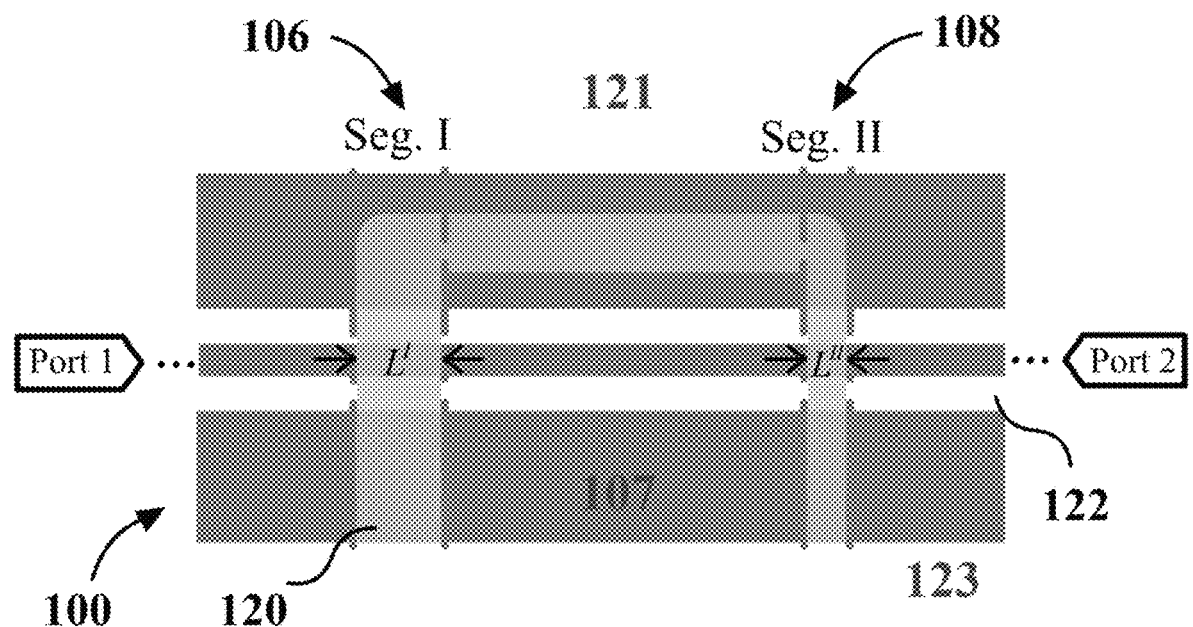
FIG. 1(a) illustrates a schematic block diagram of a coplanar-waveguide transmission line with a single microfluidic channel as an exemplary embodiment of the methodology.

Referring to the drawings, FIG. 1(a) illustrates a schematic block diagram of a coplanar-waveguide (CPW) transmission line (TL) with a single microfluidic channel as an exemplary embodiment of the methodology. The CPW comprises sections 100, 102, 104, 106 and 108. The microfluidic channel comprises sections 110, 112 and 114. Section 102 intercepts with section 110, and section 106 intercepts with section 114. The length ratio between 102 and 104 is L':L". During MUM measurements, the CPW experiences three different states. Before MUM reaches the section 102, air fills both 102 and 106. The second state is when MUM fills 102 but not 106. The third state is when MUM fills both 102 and 106. The order to fill TL line sections with MUM can be reversed.

Full S-parameters for the three states can be recorded in a single-connection measurement while the vector network analyzer performs measurement operations continuously.

Figure 1B:
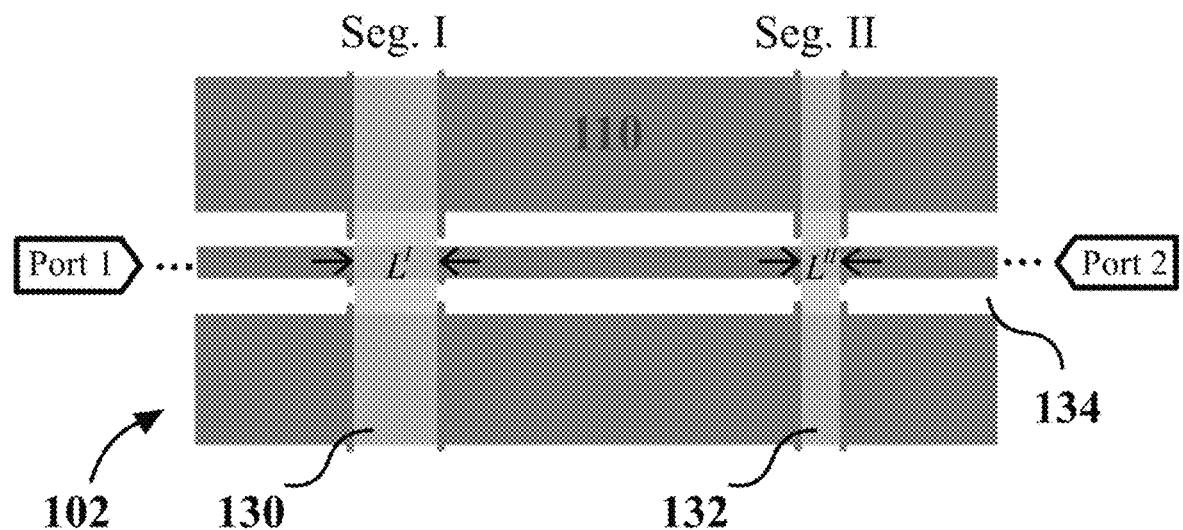
FIG. 1(b) illustrates a schematic block diagram of a coplanar-waveguide transmission line with two disconnected microfluidic channels as an exemplary embodiment of the methodology.

Referring to the drawings, FIG. 1(b) illustrates a schematic block diagram of a coplanar-waveguide transmission line with two disconnected microfluidic channels as an exemplary embodiment of the methodology. The CPW comprises sections 120, 122, 124, 126 and 128. The two microfluidic channel sections 130 and 132 are connected together with external tubing or connected to separate material delivery devices. Section 122 intercepts with section 130, and section 126 intercepts with section 132. The length ratio between 122 and 126 is L':L". During MUM measurements, the CPW experiences three different states. Before MUM reaches the section 122, air fills both 122 and 126. The second state is when MUM fills 122 but not 126. The third state is when MUM fills both 122 and 126. Full S-parameters for the three states can be recorded in a single-connection measurement while the vector network analyzer performs measurement operations continuously.

Figure 1C:
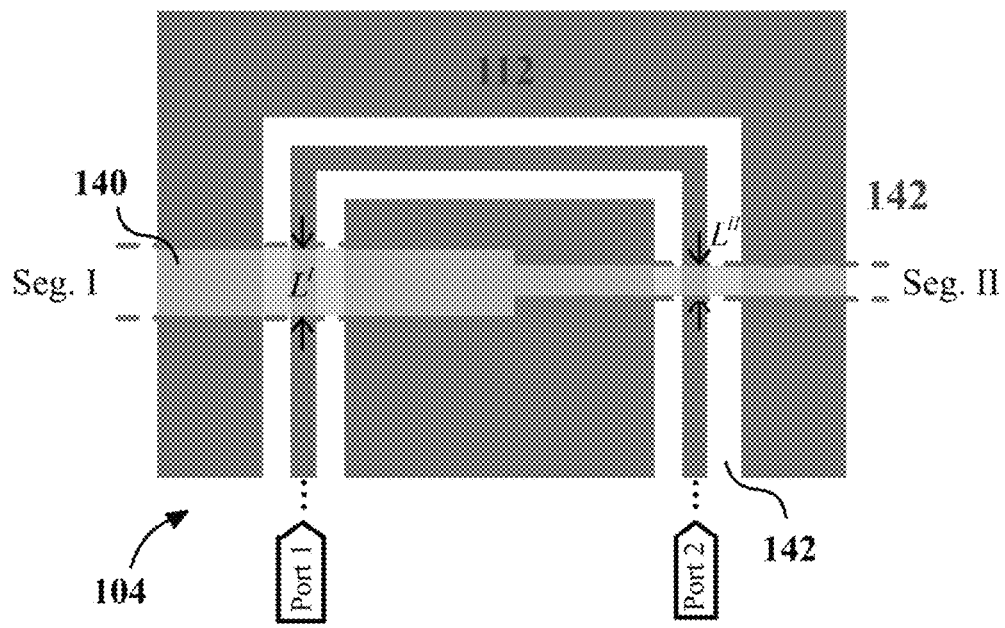
FIG. 1(c) illustrates a schematic block diagram of a meandered coplanar-waveguide transmission line with a single microfluidic channel as an exemplary embodiment of the methodology.

FIG. 1(c) illustrates a schematic block diagram of a meandered coplanar-waveguide transmission line with a single microfluidic channel as an exemplary embodiment of the methodology; The CPW comprises sections 140, 142, 144, 146 and 148. The microfluidic channel has two sections 150 and 152. Section 142 intercepts with section 150, and section 146 intercepts with section 152. The width ratio between 142 and 146 is L':L". During MUM measurements, the CPW experiences three different states. Before MUM reaches the section 142, air fills both 142 and 146. The second state is when MUM fills 142 but not 146. The third state is when MUM fills both 142 and 146. Full S-parameters for the three states can be recorded in a single-connection measurement while the vector network analyzer performs measurement operations continuously.

Figure 1D:
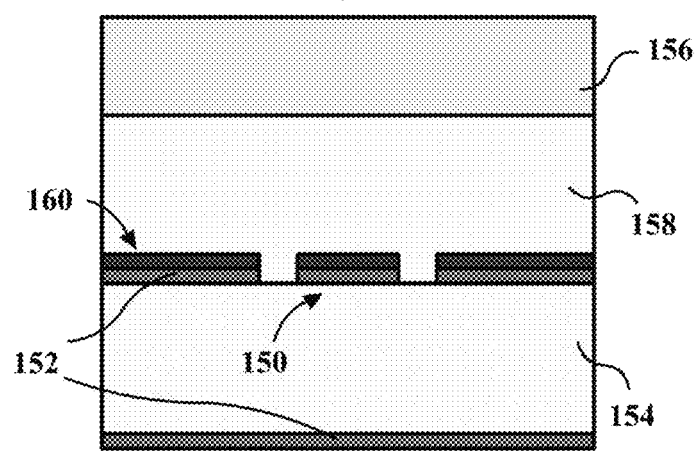
FIG. 1(d) illustrates a cross-section view of a coplanar waveguide with microfluidic channel according to an exemplary embodiment of the presented method.

Referring now to FIG. 1(d), a cross-section view of the TL section with the microfluidic channel in FIG. 1(a)-(c) is illustrated. The conductor backed coplanar waveguide (CPW) is demonstrated as an example, which comprises metallic signal line 160, ground 162, and substrate 164. Other types of transmission line, such as microstrip line, slot line or rectangular waveguide, are also applicable. The microfluidic channel cover 166 covering the TL can be filled with air or material-under-measurement (MUM) 168. A dielectric layer 170 can be optionally coated on the metallic line 160, 162 for different MUM measurements, such as polymer for gas measurement.

Figure 2:
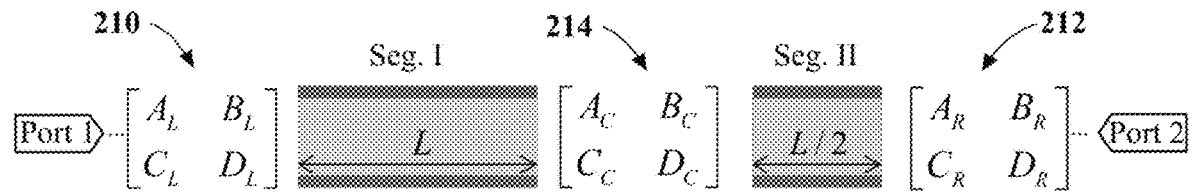
FIG. 2 illustrates a diagram representing a cascaded network of the transmission line comprising five dual-port networks according to an exemplary embodiment of the presented method.

Referring now to FIG. 2, a diagram representing a cascaded network of the devices in FIG. 1 with ABCD matrices is presented. The network between ports 1 and 2 is comprised of left network 200, section 202, center network 204, Section 206 and right network 208. Therein, left and right networks 200, 208 include all the connections between ports 1 and 2 and sections 202, 206. The center network 204 isolates sections 202, 206 and provides or enables a time delay needed for measurements and data recording. For sections 202 and 206 transmission line sections, their ABCD matrices are:

$$M^{I(II)} = \begin{bmatrix} \cosh(\gamma^{I(II)} L^{I(II)}) & Z^{I(II)} \sinh(\gamma^{I(II)} L^{I(II)}) \\ \frac{1}{Z^{I(II)}} \sinh(\gamma^{I(II)} L^{I(II)}) & \cosh(\gamma^{I(II)} L^{I(II)}) \end{bmatrix} \quad (1)$$

The two TL sections have the same cross section geometry, thus identical propagation constant, $\gamma' = \gamma'' = \gamma = \alpha + j\beta$, and characteristic impedance $Z' = Z'' = Z$ when air or MUM filled both sections and when MUM is at the same temperature as the system in FIG. 1. The overall ABCD matrix of the 2-port network is $$M_{Left} M_i' M_{Center} M_i'' M_{Right} = M_i \quad (2)$$

where subscript i denotes one of the three states of sections 202, 206.

At (700), the measurement procedure for an exemplary embodiment in the present disclosure is demonstrated. The measured scattering parameters of the device in three states are described as the following:

1) At (702), both section 202 and section 206 are full of air.

$$M_{Left} M_{air}' M_{Center} M_{air}'' M_{Right} = M_1 \quad (3)$$

2) At (704), section 202 is filled with MUM while section 206 with air.

$$M_{Left} M_{liquid}' M_{Center} M_{air}'' M_{Right} = M_2 \quad (4)$$

3) At (710), both sections 202, 206 are full of MUM.

$$M_{Left} M_{liquid}' M_{Center} M_{liquid}'' M_{Right} = M_3 \quad (5)$$

Multiply matrix $M_1$ ($M_2$) by the inverse matrix of $M_2$ ($M_3$), we obtain:

$$M_{Left} M_{air}' (M_{liquid}')^{-1} (M_{Left})^{-1} = M_1 M_2^{-1} \quad (6)$$

$$(M_{Left} M_{liquid}' M_{Center}) M_{air}'' (M_{liquid}'')^{-1} (M_{Left} M_{liquid}' M_{Center})^{-1} = M_2 M_3^{-1} \quad (7)$$

Notice that $M_1 M_2^{-1} (M_2 M_3^{-1})$ and $M_{air}' (M_{liquid}')^{-1} (M_{air}'' (M_{liquid}'')^{-1})$ are similar matrices. According to trace matrix theory, we can obtain:

$$A = Tr(M_1 M_2^{-1}) \quad (8)$$

$$= Tr(M_{air}' (M_{liquid}')^{-1})$$

$$= 2\cosh(\gamma_{air} L') \cosh(\gamma_{liquid} L') -$$

$$\left( \frac{Z_{air}}{Z_{liquid}} + \frac{Z_{liquid}}{Z_{air}} \right) \sinh(\gamma_{air} L') \sinh(\gamma_{liquid} L')$$

$$B = Tr(M_2 M_3^{-1}) \quad (9)$$

$$= Tr(M_{air}'' (M_{liquid}'')^{-1})$$

$$= 2\cosh(\gamma_{air} L'') \cosh(\gamma_{liquid} L'') -$$

$$\left( \frac{Z_{air}}{Z_{liquid}} + \frac{Z_{liquid}}{Z_{air}} \right) \sinh(\gamma_{air} L'') \sinh(\gamma_{liquid} L'')$$

For generality, we define the length ratio of section 202 and section 206 is always larger or equal to 1, i.e.

$$\frac{L^I}{L^{II}} \geq 1.$$

After collecting the S-parameters of the first two states, we need to determine if the length ratio is equal to 2 at (706). For the case $$\frac{L^I}{L^{II}} \neq 2$$

at (708), root-searching algorithm techniques can be used to solve eq. (8) or (9) for $\gamma_{liquid}$. For the case $$\frac{L^I}{L^{II}} = 2$$

at (710), the S-parameters of the third state allows the removal of term $$\left( \frac{Z_{air}}{Z_{liquid}} + \frac{Z_{liquid}}{Z_{air}} \right)$$

in eqs. (8) and (9) by using the sums of arguments rule of hyperbolic function:

$$4\cosh^2\left(\gamma_{liquid} \frac{L}{2}\right) - \quad (10)$$

$$4B \cosh\left(\gamma_{air} \frac{L}{2}\right) \cosh\left(\gamma_{liquid} \frac{L}{2}\right) + A + 4\cosh^2\left(\gamma_{air} \frac{L}{2}\right) - 2 = 0$$

Since $$\cosh\left(\gamma_{air} \frac{L}{2}\right)$$

can be calculated with eq. (13) below when device dimensions and air permittivity are known, eq. (10) can be considered as a quadratic equation of $$\cosh\left(\gamma_{liquid} \frac{L}{2}\right).$$

Then, the transmission-line propagation constants can be obtained from the measured S-parameters in three states with the following formulas at (712):

$$\gamma_{liquid,1}^{1,2} = \cosh^{-1}\left[\frac{B\cosh\left(\gamma_{air}\frac{L}{2}\right) - \frac{\sqrt{(B^2-4)\cosh^2\left(\gamma_{air}\frac{L}{2}\right) - A + 2}}{2}}{2}\right] \cdot \frac{2}{L} \quad (11)$$

$$\gamma_{liquid,2}^{1,2} = \cosh^{-1}\left[\frac{B\cosh\left(\gamma_{air}\frac{L}{2}\right) + \frac{\sqrt{(B^2-4)\cosh^2\left(\gamma_{air}\frac{L}{2}\right) - A + 2}}{2}}{2}\right] \cdot \frac{2}{L} \quad (12)$$

where $\gamma^1$ and $\gamma^2$ are two eigenvalue solutions from $$\cosh\left(\gamma_{liquid}\frac{L}{2}\right).$$

They describe and incident and a reflected wave with $\gamma^1 = -\gamma^2$. Furthermore, the physically meaningful propagation constant needs to be identified from $\gamma_{liquid,1}^{1,2}$ and $\gamma_{liquid,2}^{1,2}$. Some educated, but often obvious, rules can be exploited from the obtained and $|\alpha|$ and $|\beta|$. For a reasonable $\gamma$ solution, its $\alpha_{liquid}$ is expected to be larger than $\alpha_{air}$ and have the same sign as $\beta_{liquid}$ for each frequency.

With the obtained $\gamma$ values, MUM permittivity can be obtained by use of geometry and material specific models at (714). Many of which are available in literature, such as the following one:

$$\gamma = \alpha_c + j\frac{2\pi f}{c}\sqrt{\varepsilon_{eff}} = \alpha_c + j\frac{2\pi f}{c}\sqrt{q\varepsilon_1 + C_0} \quad (13)$$

where c is the speed of light in vacuum, $\varepsilon_{eff}$ is the effective permittivity, $\varepsilon_1$ is the relative permittivity of MUM, and q and $C_0$ are constants that can be derived from conformal mapping (CM) or single layer reduction techniques. Conductor loss ($\alpha_c$) can also be considered for better accuracy.

The equations to calculate $\gamma$ from measured S-parameters are applicable to any type of transmission lines even though different transmission lines have different models to extract MUM permittivity from $\gamma$.

Figure 3A:
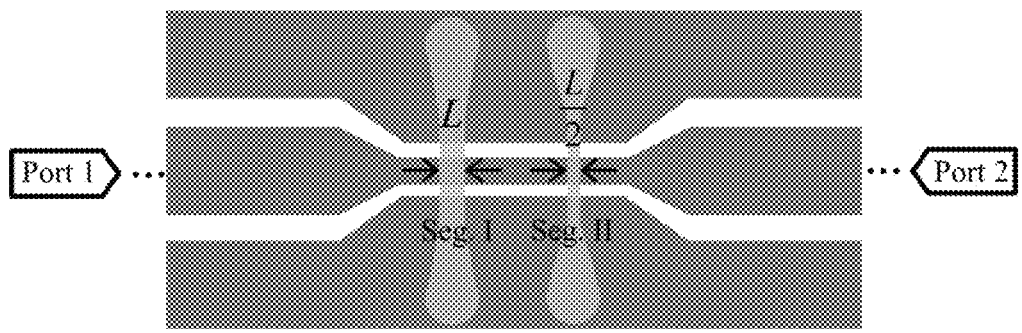
FIG. 3(a) illustrates a top view of a coplanar waveguide based measurement device for liquid property measurement as an exemplary embodiment of the methodology.
Figure 3B:
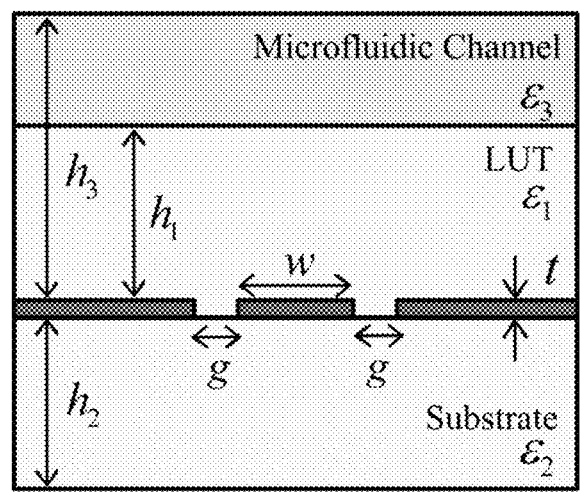
FIG. 3(b) illustrates a cross-section view of a coplanar waveguide (CPW) with microfluidic channel according to an exemplary embodiment of the presented methodology.
Figure 4A:
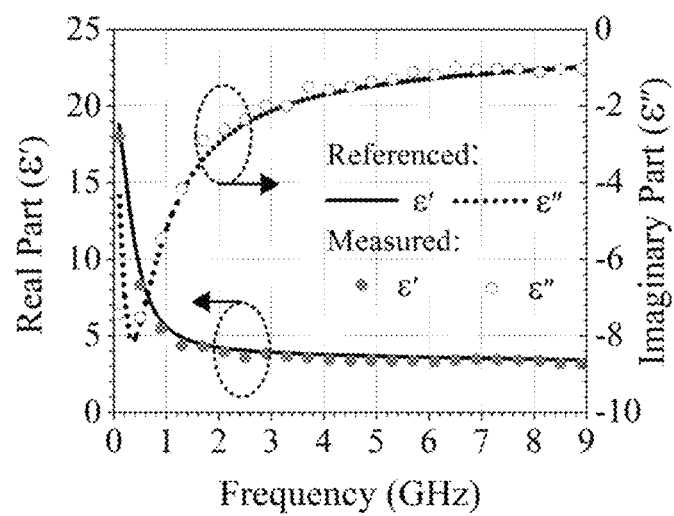
Figure 4B:
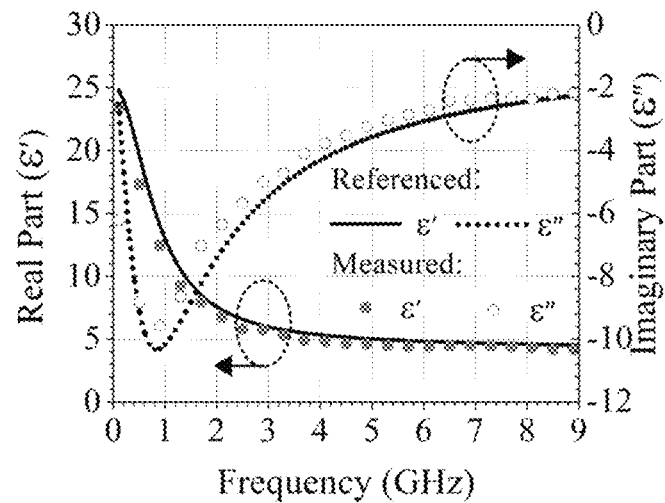
Figure 4C:
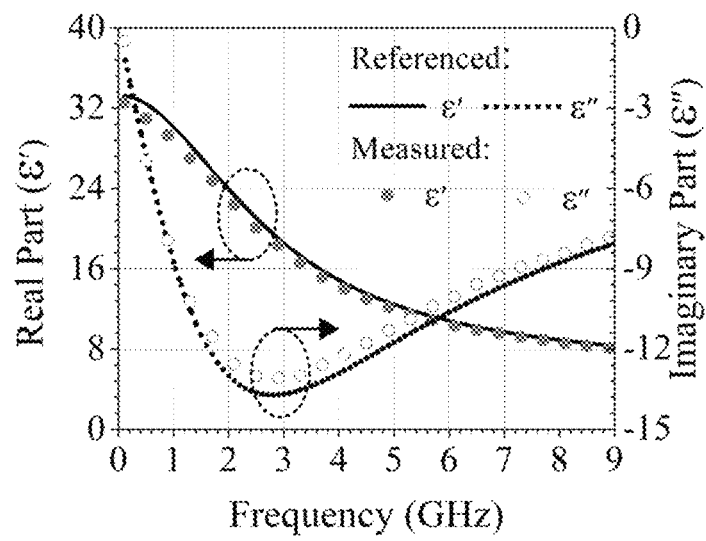
Figure 4D:
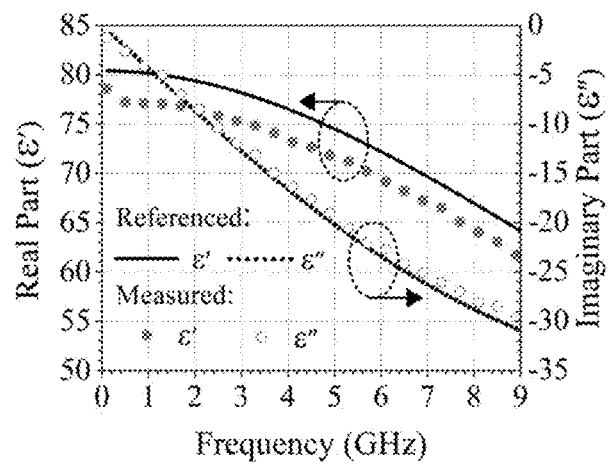

Referring to FIG. 3(*a*) a top view of the experimental device constructed according to an exemplary embodiment of the presented methodology is illustrated. In accordance with one embodiment, the two microfluidic channels have a width ratio of 2:1 and are connected together with a capillary tube to form a one-channel device for single-channel and single-connection measurement demonstration without the need for liquid reference materials or calibration standards. FIG. 3(*b*) shows the cross section of the microfluidic channels (sections 202 and 206) on the device. In accordance with one embodiment, the upper $\varepsilon_3$ layer may be constructed by polydimethylsiloxane (PDMS). The lower $\varepsilon_2$ layer can be constructed from various materials, such as glass, quartz and/or silicon. The coplanar waveguide is illustrated with signal line width w and gap g.

Referring to FIG. 4(*a*)-(*d*), plots illustrating the comparison between measured $\varepsilon_{liquid}^*$ and Cole-Cole model are presented for deionized (DI) water, methanol, ethanol and IPA, respectively. The samples are measured separately, using air as reference in accordance with an embodiment of the present method. The plots reveal that, for all the MUMs, the obtained $\varepsilon_{liquid}^*$ agree with Cole-Cole model reasonably well. The calculated correlation coefficients $R^2$ further confirm the agreement since $R^2$ are higher than 0.937 for both real and imaginary permittivity components. Besides, the average relative errors (AREs) of the MUM permittivity are lower than 7.28%. ARE is defined as $$ARE = \frac{1}{N}\sum_{i=1}^{N}\left|\frac{\varepsilon_i^{Measured} - \varepsilon_i^{reference}}{\varepsilon_i^{reference}}\right| \times 100\% \quad (14)$$

to describe spectrum accuracy, where N is the number of measured frequency points over the spectrum.

Referring to FIG. 5(*a*), a plot illustrating measurement results of DI water and IPA in succession in an embodiment are shown. FIG. 5(*b*) shows $|S_{21}|$ vs. time at 2 GHz. The five phases of different channel conditions are clearly shown. By using the proposed method, the permittivity of DI water can be extracted from Phase I to Phase III with air as reference. Then the permittivity of IPA can be extracted from Phase III to Phase X by considering DI water as a reference material.

Referring now to FIG. 6(*a*)-(*b*), plots illustrating the comparison between measured $\varepsilon_{liquid}^*$ and Cole-Cole model for DI water and IPA in succession is presented. The extracted $\varepsilon_{liquid}^*$ agrees with results from Cole-Cole model reasonably well. The correlation coefficients $R^2$ are higher than 0.948 and the AREs are lower than 7.11% for both MUMs.

Experimental Measurement

A coplanar waveguide (CPW) with two microfluidic channels in FIG. 3, is built to verify the proposed method. The microfluidic channels made by polydimethylsiloxane (PDMS) are bonded to the CPW to hold MUMs. The CPW and glass substrate surface serve as the bottom wall of the microfluidic channels. The device is fabricated with standard microfabrication techniques on a 700-µm-thick quartz wafer. A 200-nm-thick gold film was deposited on a 20-nm-thick Ti adhesion layer to form a CPW structure. The signal line width of the CPW is 40 um and the gap is 5 um. The microfluidic channels are placed perpendicular to transmission line, with a length of 200 um and 100 um, respectively, along the CPW. The channel height is 100 um and the PDMS thickness is 3 mm. The device is settled on a brass holder for better resistance to mechanical vibration and parasitic modes that can dominate at high frequencies. A vector network analyzer (VNA) is used to measure the 2-port S parameters from 100 MHz to 9 GHz.

In embodiment I, where the two channels are not connected together, de-ionized (DI) water, methanol, ethanol and 2-propanol (IPA) from Sigma-Aldrich (US), are measured separately. For each of the sample liquids, the S-parameters of the three states are obtained. Each measurement is repeated three times. The measured data are then processed by use of eqs. (11) and (12) to obtain $\gamma_{liquid}$. The complex permittivity of the MUM is obtained from eq. (5). FIG. 4 shows the obtained $\varepsilon_{liquid}^*$ for each MUM. The results agree with Cole-Cole model reasonably well. The calculated correlation coefficients $R^2$ further confirm the agreement since $R^2$ are higher than 0.937 for both real and imaginary permittivity components. Besides, the average relative errors (AREs) of the MUM permittivity are lower than 7.28%.

In embodiment II, where the two microfluidic channels are connected together with a silicone tubing to form a single channel, DI water and IPA are measured in succession. The 100 mm long tubing has a 0.51 mm inner diameter and provides 60 s delay time. The obtained S parameters, such as $S_{21}$ magnitude, are plotted in FIG. 5. FIG. 5(b) shows $|S_{21}|$ vs. time at 2 GHz, where the five phases of different channel conditions are clearly shown. By using the proposed method, the permittivity of DI water can be extracted from Phase I to Phase III with air as reference. Then the permittivity of IPA can be extracted from Phase III to Phase X by considering DI water as a reference material. FIG. 6 shows the extracted $\varepsilon_{liquid}^*$, which agrees with results from Cole-Cole model. The correlation coefficients $R^2$ are higher than 0.948 and the AREs are lower than 7.11% for both MUMs. The measurement accuracy is comparable with the results in separate-channel measurements.

In addition to measuring material properties, the present methodology has significant applicability in the development of portable, quantitative and fast RF/microwave probes that are easy to operate.

Such probes can be used to characterize various materials in-situ and on-line for real-time monitoring.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for measuring the dielectric properties of liquids using a transmission line, wherein the transmission line comprises:
 a signal line; and
 two fluidic channel sections, wherein said fluidic channel sections are perpendicular to said signal line,
 wherein each of said fluidic channel sections have rectangular cross sections, wherein the widths of said fluidic channel sections are parallel to said signal line, wherein the width ratio of said two fluidic channel sections is 2:1, wherein said fluidic channel sections intercept said signal line, and wherein said transmission line has an L section on the side that the fluidic channel has the larger width and a 0.5 L section on the side with the smaller width;
 wherein said transmission line is connected to a device for measuring an amplitude and phase of reflected and transmitted electromagnetic signals and for measuring two-port scattering parameters of said transmission line,
 the method comprising:
 (a) measuring a plurality of scattering parameters of said transmission line at selected frequencies while said two fluidic channel sections are empty;
 (b) converting the scattering parameters to ABCD matrices M1;
 (c) measuring a plurality of scattering parameters of said transmission line at the selected frequencies while one of said fluidic channel sections is filed with said liquid and the other said fluidic channel section is empty;
 (d) converting the scattering parameters to ABCD matrices M2;
 (e) measuring a plurality of scattering parameters of said transmission line at the selected frequencies while said two fluidic channel sections are filed with said liquid;
 (f) converting the scattering parameters to ABCD matrices M3;
 (g) determining the propagation constant $\gamma_{liquid}$ of said transmission line sections while said fluidic channel sections are filled with said liquid by using the expression:

$$\gamma_{liquid}^{1,2} = \frac{2}{L} \cdot \cosh^{-1}\left(\frac{B \cdot \cosh\left(\gamma_{air} \cdot \frac{L}{2}\right) \pm \sqrt{(B^2 - 4)\cosh^2\left(\gamma_{air} \cdot \frac{L}{2}\right) - A + 2}}{2}\right)$$

A=Tr(M1M2) and B=Tr(M2M3°), while $\gamma_{air}$, is the propagation constant of said empty transmission line L and 0.5 L sections;
 (h) determining the relative complex permittivity, ε1, for said liquid based on $\gamma_{liquid}$.

2. A method for measuring the dielectric properties of liquids using a transmission line, wherein the transmission line comprises:
 a signal line; and
 two fluidic channel sections, wherein said fluidic channel sections are perpendicular to said signal line,
 wherein each of said fluidic channel sections have rectangular cross sections, wherein the widths of said fluidic channel sections are parallel to said signal line, wherein the width ratio of said two fluidic channel sections is 2:1, wherein said fluidic channel sections intercept said signal line, and wherein said transmission line has an L section on the side that the fluidic channel has the larger width and a 0.5 L section on the side with the smaller width;
 wherein said transmission line is connected to a device for measuring an amplitude and phase of reflected and transmitted electromagnetic signals and for measuring two-port scattering parameters of said transmission line, the method comprising:
 (a) obtaining a material, wherein said material is a liquid or gas, wherein said material has known complex permittivities;
 (b) measuring a plurality of scattering parameters of said transmission line at selected frequencies while said two fluidic channel sections are filled with said material;
 (c) converting the scattering parameters to ABCD matrices M1;
 (d) measuring a plurality of scattering parameters of said transmission line at the selected frequencies while one of said fluidic channel sections is filed with said liquid and the other said fluidic channel section is filled with said material;
 (e) converting the scattering parameters to ABCD matrices M2;
 (f) measuring a plurality of scattering parameters of said transmission line at the selected frequencies while said two fluidic channel sections are filed with said liquid;
 (g) converting the scattering parameters to ABCD matrices M3;
 (h) determining the propagation constant $\gamma_{liquid}$ of said transmission line sections while said fluidic channel sections are filled with said liquid by using the expression:

$$\gamma_{liquid}^{1,2} =$$

$$\frac{2}{L} \cdot \cosh^{-1}\left(\frac{B \cdot \cosh\left(\gamma_{material} \cdot \frac{L}{2}\right) \pm \sqrt{(B^2 - 4)\cosh^2\left(\gamma_{material} \cdot \frac{L}{2}\right) - A + 2}}{2}\right)$$

A=Tr(M1M2) and B=Tr(M2M3°), while $\gamma_{material}$, is the propagation constant of said transmission line L and 0.5 L sections while said fluidic channel sections are filled with said material;

(i) determining the relative complex permittivity, ε1, for said liquid based on $\gamma_{liquid}$.

* * * * *